United States Patent
Huang et al.

(10) Patent No.: US 10,700,000 B2
(45) Date of Patent: Jun. 30, 2020

(54) SEMICONDUCTOR STRUCTURE AND METHOD MAKING THE SAME

(71) Applicant: Taiwan Semiconductor Manufacturing Company, Ltd., Hsinchu (TW)

(72) Inventors: Hsin-Yen Huang, Yonghe (TW); Kai-Fang Cheng, Taoyuan (TW); Chi-Lin Teng, Taichung (TW); Hai-Ching Chen, Hsin-Chu (TW); Tien-I Bao, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 11 days.

(21) Appl. No.: 15/601,305

(22) Filed: May 22, 2017

(65) Prior Publication Data

US 2017/0256491 A1    Sep. 7, 2017

Related U.S. Application Data

(62) Division of application No. 14/106,460, filed on Dec. 13, 2013, now Pat. No. 9,659,857.

(51) Int. Cl.
| | |
|---|---|
| *H01L 23/522* | (2006.01) |
| *H01L 21/02* | (2006.01) |
| *H01L 23/532* | (2006.01) |
| *H01L 21/311* | (2006.01) |
| *H01L 21/768* | (2006.01) |

(52) U.S. Cl.
CPC ...... *H01L 23/5226* (2013.01); *H01L 21/0228* (2013.01); *H01L 21/02178* (2013.01); *H01L 21/02271* (2013.01); *H01L 21/02274* (2013.01); *H01L 21/31111* (2013.01); *H01L 21/76832* (2013.01); *H01L 21/76834* (2013.01); *H01L 21/76849* (2013.01); *H01L 23/5329* (2013.01); *H01L 23/53295* (2013.01); *H01L 21/76807* (2013.01); *H01L 23/53223* (2013.01); *H01L 23/53238* (2013.01); *H01L 23/53266* (2013.01); *H01L 2924/0002* (2013.01)

(58) Field of Classification Search
CPC ........... H01L 23/53238; H01L 23/5226; H01L 23/5329; H01L 23/53295; H01L 23/53223; H01L 23/53266
See application file for complete search history.

(56) References Cited

U.S. PATENT DOCUMENTS

| | | | |
|---|---|---|---|
| 5,434,438 A | 7/1995 | Kuo | |
| 2003/0111729 A1* | 6/2003 | Leu | ......... H01L 21/288 257/758 |
| 2005/0001318 A1 | 1/2005 | Won | |
| 2006/0157851 A1* | 7/2006 | Kawashima | ...... H01L 21/31116 257/750 |

(Continued)

*Primary Examiner* — Peniel M Gumedzoe
(74) *Attorney, Agent, or Firm* — Haynes and Boone, LLP (57) ABSTRACT

The present disclosure provides a method for forming an integrated circuit (IC) structure. The method comprises providing a substrate including a conductive feature; forming aluminum (Al)-containing dielectric layer on the conductive feature; forming a low-k dielectric layer on the Al-containing dielectric layer; and etching the low-k dielectric layer to form a contact trench aligned with the conductive feature. A bottom of the contact trench is on a surface of the Al-containing dielectric layer.

20 Claims, 6 Drawing Sheets

(56) References Cited

U.S. PATENT DOCUMENTS

| | | | |
|---|---|---|---|
| 2007/0148966 A1* | 6/2007 | Baks | H01L 21/31116 |
| | | | 438/638 |
| 2007/0290347 A1 | 12/2007 | Dostalik et al. | |
| 2010/0308463 A1 | 12/2010 | Yu et al. | |
| 2010/0314777 A1* | 12/2010 | Oda | H01L 21/76804 |
| | | | 257/774 |
| 2011/0254165 A1* | 10/2011 | Muranaka | H01L 21/76832 |
| | | | 257/751 |
| 2012/0252210 A1 | 10/2012 | Tohnoe | |
| 2013/0105996 A1 | 5/2013 | Brink et al. | |
| 2013/0292835 A1* | 11/2013 | King | H01L 21/02178 |
| | | | 257/741 |
| 2014/0199832 A1* | 7/2014 | Nguyen | H01L 21/02244 |
| | | | 438/637 |

\* cited by examiner

SEMICONDUCTOR STRUCTURE AND METHOD MAKING THE SAME

PRIORITY DATE

This application is a divisional of U.S. patent application Ser. No. 4/106460, filed Dec. 13, 2013, now U.S. Pat. No. 9,659,857, the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

In semiconductor technology, an integrated circuit pattern can be formed on a substrate using various processes including a photolithography process, ion implantation, deposition and etch. Damascene processes are utilized to form multilayer copper interconnections including vertical interconnection vias and horizontal interconnection metal lines. During a damascene process, trenches are formed in a dielectric material layer, copper or tungsten is filled in the trenches, then a chemical mechanical polishing (CMP) process is applied to remove excessive metal on the dielectric material layer and planarize the top surface. Studies and researches have been conducted to search, new conductive, dielectric materials, and new process integration schemes for a better interconnection. New interconnection materials, such as integrating copper metallurgy in place of traditional aluminum can be used to reduce the resistance component of the RC time delay. New insulating material with a lower dielectric constant (k) than the incumbent silicon dioxide can be applied to reduce the capacitance component as well as cross-talk between conductive lines to minimize time delay and power dissipation. In addition, metal capping or silicide capping can be used to overcome the reliability problem caused by the dimensions scaling down.

Although existing approaches have been generally serving their intended purposes, they have not been entirely satisfactory in all respects. Accordingly, a semiconductor structure including a cap layer and a method making the same are needed.

BRIEF DESCRIPTION OF THE DR WINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
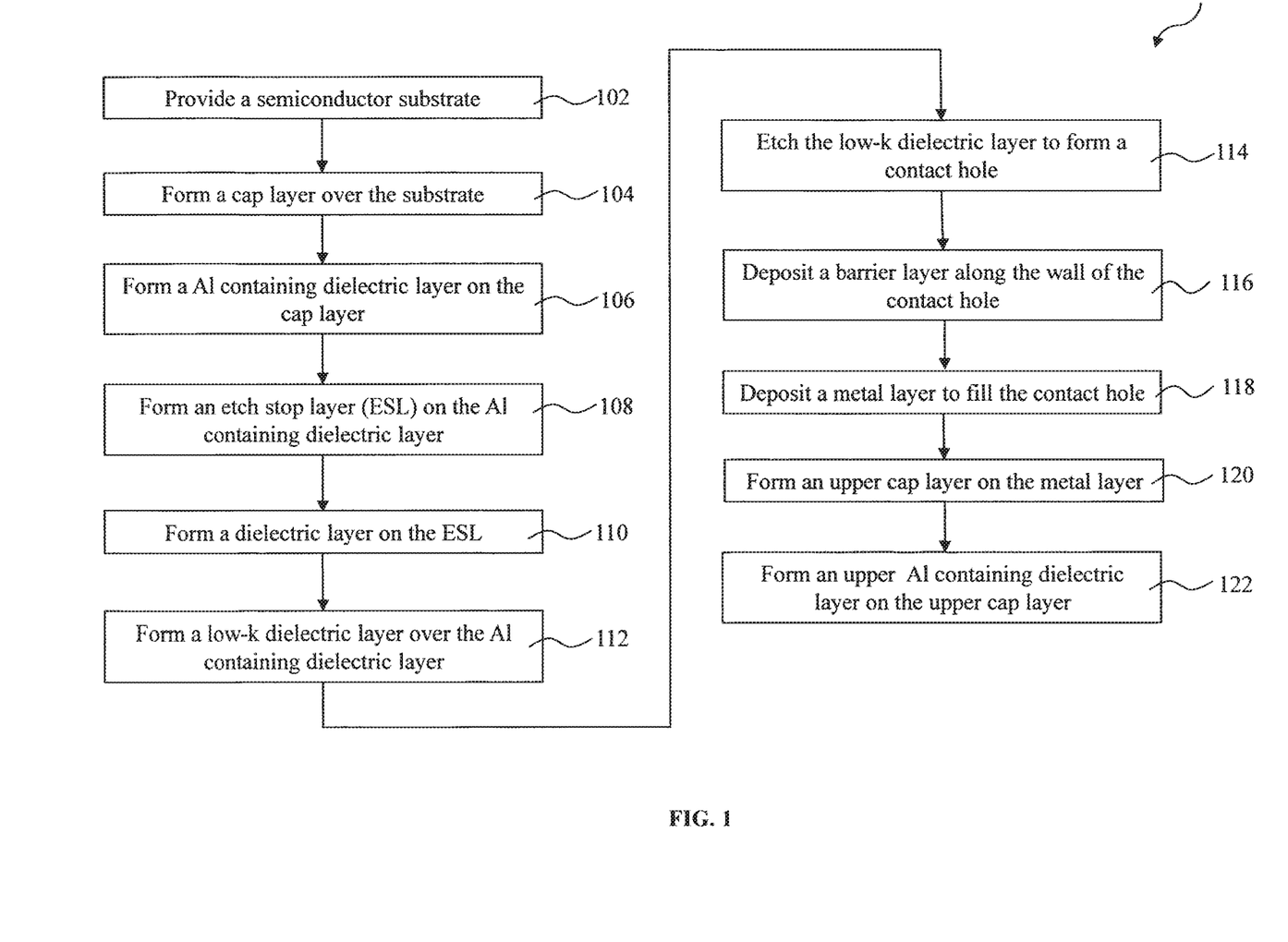
FIG. 1 illustrates a flowchart of a method to form an integrated circuit (IC) structure including an aluminum (Al)-containing dielectric layer according to some embodiments of the present invention.

FIG. 1 illustrates a flowchart of a method 100 to form an integrated circuit (IC) structure including an aluminum (AO-containing dielectric layer according to some embodiments of the present invention. FIGS. 2-5 are cross sectional views of an IC structure 200 including an Al-containing dielectric layer during various fabrication stages using the method 100 of FIG. 1, constructed according to various aspects of the present disclosure in one or more embodiments. The method 100 and the IC structure 200 are collectively described below with reference to FIGS. 1-5. Additional steps can be provided before, during, and after the method 100, and some of the steps described can be replaced or eliminated for additional embodiments of the method. The discussion that follows illustrates various embodiments of the IC structure 200 that can be fabricated according to the method 100 of FIG. 1.

Figure 2:
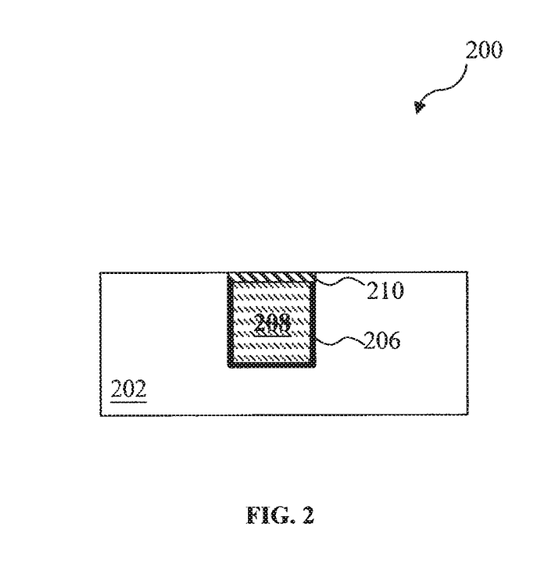
FIGS. 2-7 are cross sectional views of an IC structure including an Al-containing dielectric layer during various fabrication stages using the method of FIG. 1, constructed according to various aspects of the present disclosure in one or more embodiments.

Referring to FIGS. 1 and 2, the method 100 begins at step 102 by providing a semiconductor substrate 202. The semiconductor substrate 202 may include silicon. (Si). Alternatively or additionally, the substrate 202 may include other elementary semiconductor such as germanium (Ge). The substrate 202 may also include a compound semiconductor such as silicon carbide, gallium arsenic, indium arsenide, and indium phosphide. The substrate 202 may include an alloy semiconductor such as silicon germanium, silicon germanium carbide, gallium arsenic phosphide, and gallium indium phosphide. In some embodiments, the substrate 202 includes an epitaxial layer. For example, the substrate 202 may have an epitaxial layer overlying a bulk semiconductor. In some embodiments, the substrate 202 may include a semiconductor-on-insulator (SOI) structure. For example, the substrate 202 may include a buried oxide layer formed by a process such as separation by implanted oxygen or other suitable technique, such as wafer bonding and grinding.

The substrate 202 may also includes various p-type doped regions and/or n-type doped regions, implemented by a process such as ion implantation and/or diffusion. Those doped regions include n-well, p-well, light doped region (LDD), heavily doped source and drain (S/D), and various channel doping profiles configured to form various integrated circuit (IC) devices, such as a complimentary metal-oxide-semiconductor field-effect transistor (CMOSFET), imaging sensor, and/or light emitting diode (LED). The substrate 202 may further include other functional features such as a resistor or a capacitor formed in and on the substrate. In some embodiments, the substrate 202 may further include lateral isolation features provided to separate various devices formed in the substrate 202. The isolation features may include shallow trench isolation (STI) features to define and electrically isolate the functional features. In some examples, the isolation regions may include silicon oxide, silicon nitride, silicon oxynitride, an air gap, other suitable materials, or combinations thereof. The isolation regions may be formed by any suitable process. The various IC devices may further include other features, such as silicide disposed on S/D and gate stacks overlying channels.

The IC structure 200 may also include a plurality of dielectric layers and conductive features integrated to form an interconnect structure configured to couple the various p-type and n-type doped regions and the other functional features (such as gate electrodes), resulting a functional integrated circuit. In some embodiments, the substrate 202 may include a portion of the interconnect structure and is collectively referred to as the substrate 202.

As noted above, the IC structure 200 includes an interconnect structure. The interconnect structure includes a multi-layer interconnect (MLI) structure and an inter-level dielectric (ILD) integrated with the MLI structure, providing an electrical routing to couple various devices in the substrate 202 to the input/output power and signals. The interconnect structure includes various metal lines, contacts and via features (or via plugs). The metal lines provide horizontal electrical routing. The contacts provide vertical connection between the substrate 202 and metal lines while via features provide vertical connection between metal lines in different metal layers.

As shown in FIG. 2, the IC structure 200 includes a conductive feature 208. In some embodiments, the conductive feature 208 may include a metal contact, a metal via, or a metal line. In some embodiments as shown in FIG. 2, the conductive feature 208 may be further surrounded by a barrier layer 206 to prevent diffusion and/or provide material adhesion. In some examples, the conductive feature 208 may include aluminum (Al), copper (Cu) or tungsten (W). The barrier layer 206 may include titanium nitride (TiN), tantalum nitride (TaN), tungsten nitride (WN), titanium silicon nitride (TiSiN) or tantalum silicon nitride (TaSiN). The conductive feature 208 and the barrier layer 206 may be formed by a procedure including lithography, etching and deposition. In another embodiment, the conductive feature 208 includes an electrode of a capacitor, a resistor or a portion of a resistor. Alternatively, the conductive feature 208 includes a doped region (such as a source or a drain), or a gate electrode. In another example, the conductive feature 208 includes a silicide feature disposed on respective source, drain or gate electrode. The silicide feature may be formed by a self-aligned silicide (salicide) technique.

Still referring to FIGS. 1 and 2, the method 100 proceeds to step 104 by forming a cap layer 210 on the conductive feature 208. In some embodiments, the conductive feature 208 includes Cu, and the cap layer includes a cobalt (Co) cap layer. In some alternative embodiments, the cap layer includes at least one layer of manganese (Mn), nickel (Ni), ruthenium (Ru), titanium (Ti) and/or combinations thereof. The cap layer 210 may be deposited using any suitable method, such as chemical vapor deposition (CVD) or atomic layer deposition (ALD). In some embodiments, the cap layer 210 may have a thickness in a range from about 5 Å to about 100 Å. In the present embodiment, the cap layer 210 is selectively grown on the conductive feature 208, but not the substrate 202, for capping the conductive feature 208, such as Cu line. Therefore, the cap layer 210 is self-aligned with the conductive feature 208, as shown in FIG. 2. The cap layer 210 may be formed using a metal precursor, such as Co included precursor. In some embodiments, the Co included precursor includes at least one of bis(cyclopentadienyl) cobalt(II) ($Co(C_5H_5)_2$), bis(ethylcyclopentadienyl)cobalt(II) ($C_{14}H_{18}Co$), bis(pentamethylcyclopentadienyl)cobalt(II) ($C_{20}H_{30}Co$), dicarbonylcyclopentadienyl cobalt(I) ($C_5H_5Co(CO)_2$), or cobalt carbonyl ($Co_2(CO)_8$). The cap layer 210 may effectively reduce the contact resistance and avoid the electromigration between different layers of interconnect structures. The cap layer 210 may also provide a good intrinsic adhesion between the conductive feature 208 and the subsequent layers formed on the conductive feature, such as etch stop layer (ESL), so that the material integration of the IC structure 200 can be improved.

Figure 3:
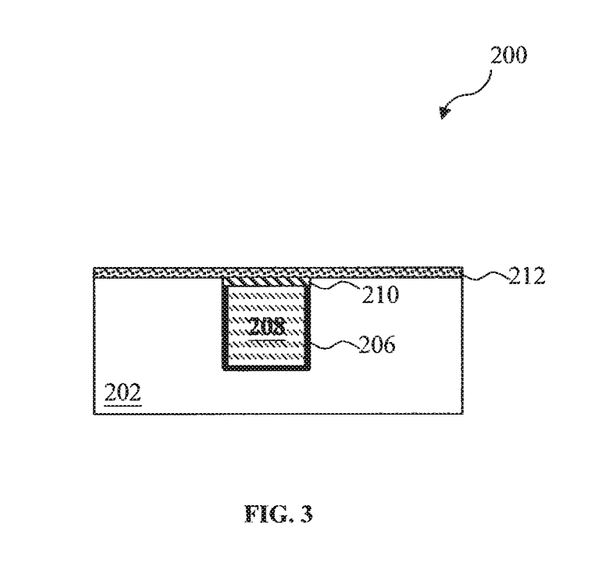
Figure 4:
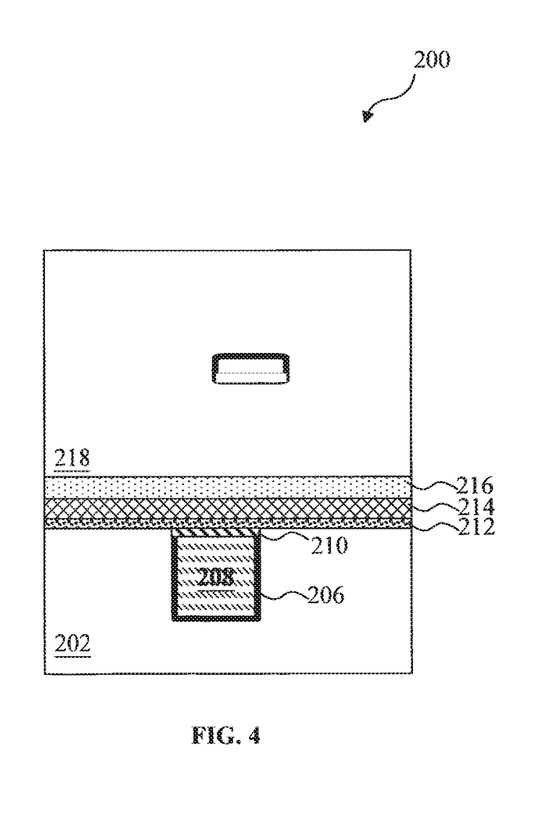

Referring to FIGS. 1 and 3, method 100 proceeds to step 106 by forming an aluminum (Al)-containing dielectric layer 212 on the cap layer 210. The Al-containing dielectric layer 212 may be formed to cover both the cap layer 210 and the part of the substrate 202 that is not covered by the cap layer 210 as shown in FIG. 4. In some embodiments, the Al-containing dielectric layer 212 includes aluminum (Al), oxygen (O), nitrogen (N) and/or combinations thereof. In some embodiments, the Al-containing dielectric layer 212 includes Al with a composition in a range from about 5 wt % to about 20 wt %. In some embodiments, the Al-containing dielectric layer 212 includes O with a composition in a range from about 60 wt % to about 80 wt %. In some embodiments, the Al-containing dielectric layer 212 includes N with a composition in a range from about 10 wt % to about 30 wt %. In a preferable embodiment, the Al-containing dielectric layer 212 includes about 10 wt % of Al, about 70 wt % of O, and about 20 wt % of N. The thickness of the Al-containing dielectric layer 212 may be controlled to have high enough etching selectivity over the low-k dielectric layer during a plasma etching process, and high enough etching selectivity over the ESL during a wet etching process. Meanwhile, the thickness of the Al-containing dielectric layer 212 may also be controlled to have low enough contact resistance. In some embodiments, the Al-containing dielectric layer 212 may have a thickness in a range from about 5 Å to about 30 Å.

In some embodiments, the Al-containing dielectric layer 212 may be formed using a. CVD or an ALD process. The precursor used to form the Al-containing dielectric layer includes an Al included organic chemical, such as trimethylaluminium (TMA). In some embodiments, the formation of the Al-containing dielectric layer 212 starts with a pre-treatment process using $NH_3$ plasma, where the deposition chamber becomes a reduced environment including N free radical. Then the Al included precursor is imported and the Al from the precursor can be bonded with the N. The Al from the precursor may also adsorb oxygen (O) that is attached to the surface of the cap layer 210, such as the surface oxidation layer of Co cap layer. In some embodiments, the $NH_3$ plasma treatment and the import of the Al included precursor are carried out for more than one cycle for depositing the Al-containing dielectric layer 212 including Al, O, and N.

In some embodiments during the deposition of the Al-containing dielectric layer, the chamber pressure is in a range from about 0.1 torr to about 100 torr. The radio frequency (RF) power is in a range from about 10 W to about 1000 W. The flow rate of $NH_3$ is in a range from about 50 sccm to about 5000 sccm. The deposition temperature is in a range from about 150° C. to about 400° C. In some preferable embodiments, the Al-containing dielectric layer 212 of the present invention is deposited at chamber pressure in a range from about 1 torr to about 10 torr. In some embodiments, the RF power for the deposition is in a range from about 200 W to about 1000 W. In some embodiments, the $NH_3$ gas flow rate is in a range from about 100 sccm to about 1000 sccm. In some embodiments, the deposition temperature is in a range from about 200° C. to about 400° C. In a preferable embodiment of the present disclosure, the Al-containing dielectric layer is deposited at a chamber pressure of about 3 torr, a RF power at about 600 W, a NH3 gas flow rate of about 500 sccm, and a deposition temperature of about 350° C. In some embodiments, the Al-containing dielectric layer 212 formed using a CVD or an ALD process has a porous structure with low density. In some embodiments, the refractive index (RI) of the Al-containing dielectric layer is in the range from about 1.76 to about 1.80.

In some embodiments, Al-containing dielectric layer 212 has a high etching selectivity over the low-k dielectric layer during a plasma etching process to form contact trenches. The Al-containing dielectric layer 212 may also have high etching selectivity over the ESL during a wet etching process to etch the ESL in the contact regions. The porous structure of the Al-containing dielectric layer 212 may enable the electron tunneling and/or the diffusion of the conductive feature (e.g., Cu) between two adjacent interconnect levels, so that the Al-containing dielectric layer can reduce the contact resistance of the IC structure. In addition, the Al-containing dielectric layer 212 may effectively prevent the cap layer 210 and/or the conductive feature 208 from being oxidized by the oxygen included plasma in the following process.

Referring to FIGS. 1 and 4, method 100 proceeds to step 108 by forming an etch stop layer (ESL) 214 on the Al-containing dielectric layer 212. In some embodiments, the ESL 214 includes a dielectric material chosen to have etching selectivity for proper etch process at subsequent processes to form contact trenches. In some embodiments, the ESL 214 may be deposited using any suitable technique, such as CVD, physical vapor deposition (PVD), ALD, or an epitaxial growing process. In some embodiments, the ESL 214 includes a silicon nitride ($Si_3N_4$) layer, a nitrogen (N) doped silicon carbide (SiC) layer, and/or combinations thereof. The ESL 214 may have a thickness in a range from about 50 Å to about 200 Å. In some embodiments, the ESL 214 is formed using materials including silane ($SiH_4$) and ammonia ($NH_3$) plasma. In some embodiments, the ESL 214 may have a dielectric constant (k) that is greater than about 5.5. The ESL 214 may have a higher density than the Al-containing dielectric layer 212. The ESL 214 May also have a lower etching selectivity than the Al-containing dielectric layer 212 during the etching process of the low-k dielectric layer to form contact trenches as discussed later in the following process. In some embodiments, the ESL 214 may be formed to cover the Al-containing dielectric layer 212 as shown in FIG. 3.

In some embodiments, with the formation of the Al-containing dielectric layer 212 in the present disclosure, the ESL 215 (of FIG. 8) may include a dielectric material that has a dielectric constant (k) less than about 5. In some embodiments, the ESL 215 includes nitrogen (N) doped silicon carbide (SiC), oxygen (O) doped SiC, and/or combinations thereof. In some embodiments, the ESL 215 may be formed using silane ($SiH_4$), and a plasma gas including $CO_2$, $N_2O$ or combinations thereof. In some embodiments, the thickness of the ESL 215 is in a range from about 10 Å to about 100 Å, as discussed later with reference to FIG. 8 in this disclosure. In some alternative embodiments, with the Al-containing dielectric layer 212 formed in the IC structure 200, the ESL may not be needed, as discussed later with reference to FIG. 9 in this disclosure.

Still referring to FIGS. 1 and 4, method 100 may proceed to an optional step 110 to form a dielectric layer 216 on the ESL 214. In some embodiments, the dielectric layer 216 may include a silicon oxide ($SiO_2$) layer configured to block gas generated from the ESL 214 from getting in contact with the photoresist material that is used to pattern the subsequent layers. Because the ESL 214 may include nitrogen (N), the ESL 214 may generate $NH_3$ gas during outgassing, and the $NH_3$ gas may diffuse to the photoresist layer to react with the photoresist layer, causing the photoresist layer to fail to be sensitive to the photons during the lithography process. Therefore, a $SiO_2$ layer 216 may be used to block the $NH_3$ outgassing from the ESL 214 to be in contact with the photoresist layer. In some alternative embodiments, the dielectric layer 216 may not be needed, as discussed later in this disclosure with reference to FIGS. 8-9.

Still referring to FIGS. 1 and 4, method 100 may proceed to step 112 by forming a low-k dielectric layer 218 over the Al-containing dielectric layer 212. In some embodiments, the low-k dielectric layer 218 may include one or more materials selected from the group consisting of fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, and combinations thereof. In some embodiments, the low-k dielectric layer 218 includes an extreme low-k dielectric material (XLK). In some embodiments, the low-k dielectric layer 218 includes a porous version of an existing Dow Corning dielectric material called FOX (flowable oxide) which is based on hydrogen silsesquioxane. A process of forming the low-k dielectric layer 218 may utilize spin-on coating or CVD. In some embodiments, a chemical mechanical polishing (CMP) process may be used to further planarize the top surface of the low-k dielectric layer 218.

Figure 5:
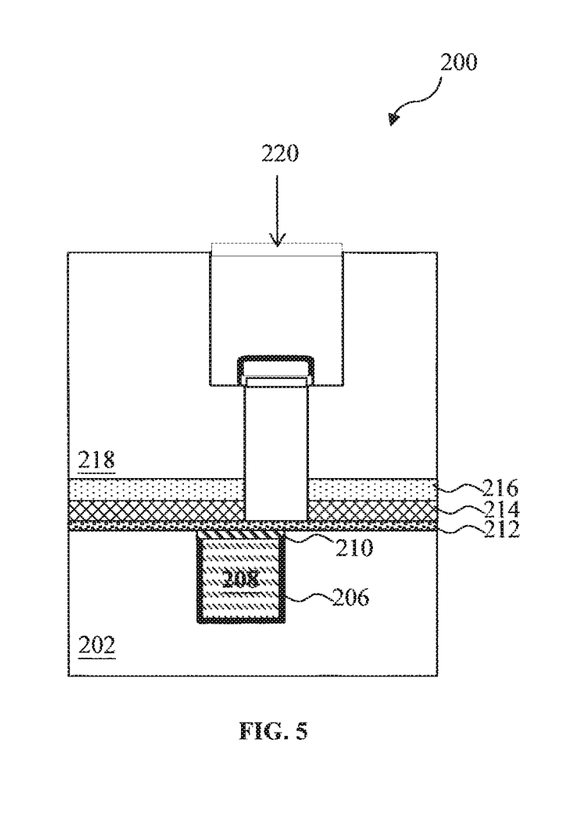

Referring to FIGS. 1 and 5, method 100 proceeds to step 114 by etching the low-k dielectric layer 218 to form a contact trench 220. In some embodiments, the contact trench 220 may be formed by a lithography process and an etching process including one or more etching steps. The lithography process is used to pattern the low-k dielectric layer 218, and the etching process is applied to etch the low-k dielectric layer 218 to expose the contact regions. In some embodiments, the etching process includes an etch step using a plasma etch with a suitable etchant, such as a fluorine-containing etchant, to selectively etch the low-k dielectric layer 218 without damaging to the conductive feature 208. In some alternative embodiments, the etching process includes a first etch step to remove the low-k dielectric layer 218 in the contact regions using a dry etch process with difluoromethane ($CH_2F_2$) plasma. The first etch step may stop at the ESL 214 so that the ESL 214 can protect the substrate 202, the conductive feature 208 and the cap layer 210, from being damaged during the first etch step. Then a second etch step is used to selectively remove the ESL 214 in the contact regions using a wet etch with a suitable etchant, such as a hot phosphorous ($H_3PO_4$) acid. The second etching step may stop at the Al-containing dielectric layer 212, so that the Al-containing dielectric layer 212 can protect the substrate 202 or the lower level interconnect features, including the conductive feature 208 or the cap layer 210, from being damaged during the second etch step. In some embodiments, the Al-containing dielectric layer 212 includes a dielectric material having high selectivity over the ESL 214 in the second etch step. Therefore, the formation of the Al-containing dielectric layer 212 may effectively reduce or eliminate the damage to the lower level interconnect feature, such as the contact feature 208.

Figure 6:
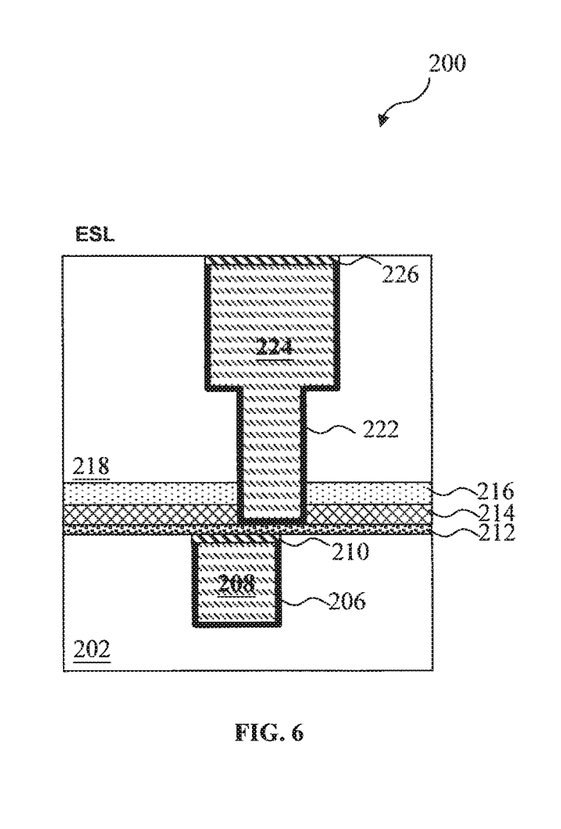

Referring to FIGS. 1 and 6, method 100 proceeds to step 116 by forming a barrier layer 222 along the wall of the contact trench 220. The barrier layer 222 may also be formed on the top surface of the Al-containing dielectric layer 212 exposed in the contact trench 220. In some embodiments, the barrier layer 222 includes metal and is electrically conductive but does not permit inter-diffusion and reactions between the low-k dielectric layer 218 and the metal layer to be filled in the contact trench 220. The barrier layer 222 may include refractory metals and their nitrides. In various examples, the barrier layer 222 includes one or more materials selected from the group consisting of TiN, TaN, Co, WN, TiSiN, TaSiN, and combinations thereof. In some embodiments, the barrier layer 222 may include multiple films. For example, Ti and TiN films may be used as the barrier layer 222. In some embodiments, the barrier layer 222 may be deposited by PVD, CVD, metal-organic chemical vapor deposition (MOCVD), ALD, other suitable techniques, or combinations thereof.

Still referring to FIGS. 1 and 6, method 100 proceeds to step 118 by depositing a metal layer 224 on the barrier layer 222 to fill the contact trench 220. In some embodiments, the metal layer 224 may include copper (Cu), aluminum (Al), tungsten (W) or other suitable conductive material. In some embodiments, the metal layer 224 may also include Cu or Cu alloy, such as copper magnesium (CuMn), copper aluminum (CuAl) or copper silicon (CuSi). In some embodiments, the metal layer 224 may be deposited by PVD. In some examples, the metal layer 224 may include Cu, and the Cu layer 224 may be formed by depositing a Cu seed layer using PVD, and then forming a bulk Cu layer by plating. In some embodiments, the metal layer 224 may include a metal contact, a metal via, or a metal line. After the deposition of the metal layer 224, a chemical mechanical polishing (CMP) process may be performed to remove excessive metal layer 224. A substantially coplanar top surface of the metal layer 224 and the low-k dielectric layer 218.

Figure 7:
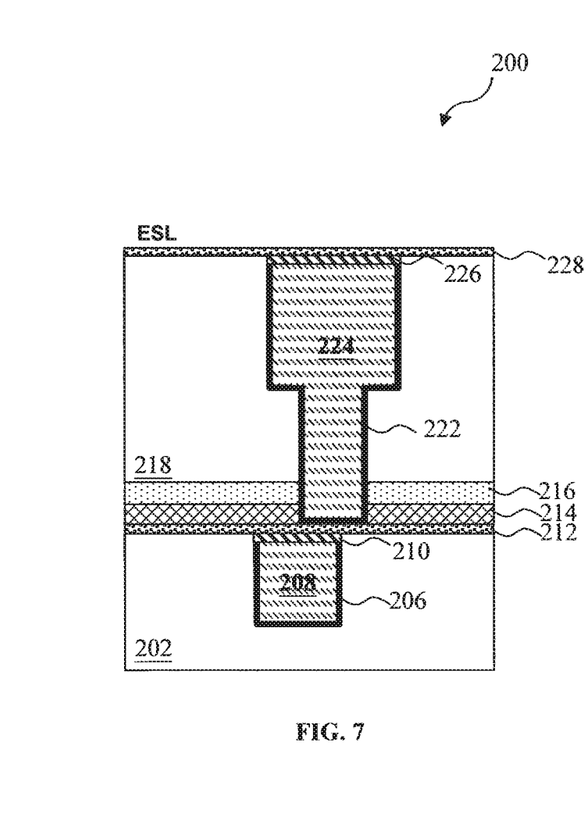

Referring to FIGS. 1 and 6, method 100 proceeds to step 120 by forming an upper cap layer 226 on the metal layer 224. The method and the upper cap layer 226 formed at step 120 may be substantially similar to that of step 104. Referring to FIGS. 1 and 7, method 100 proceeds to step 122 by forming an upper Al-containing dielectric layer 228 on the upper cap layer 226. The method and the Al-containing dielectric layer 228 formed at step 122 may be substantially similar to that of step 106.

Figure 8:
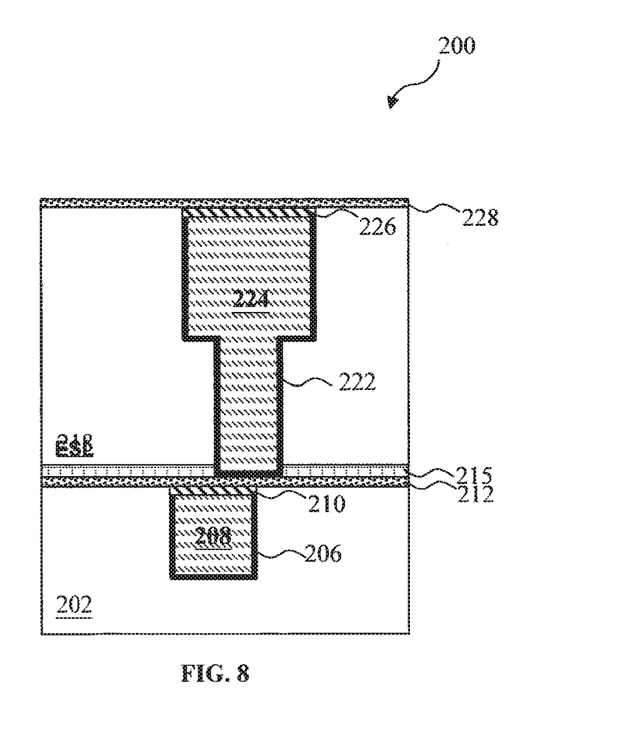
FIGS. 8-9 are some alternative embodiments of the IC structure having an Al-containing dielectric layer of FIG. 5 according to various aspects of the present disclosure.
Figure 9:
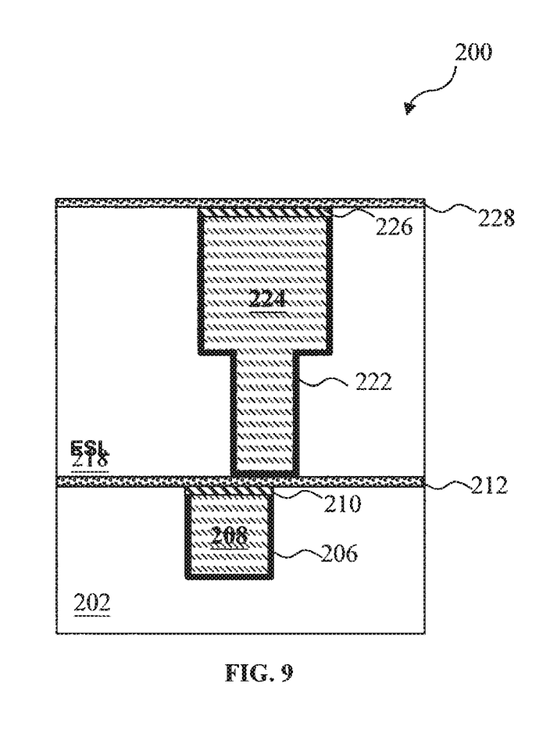

FIGS. 8-9 illustrate some alternative embodiments of the IC structure 200 having an Al-containing dielectric layer of FIG. 5 according to various aspects of the present disclosure. In some embodiments as shown in FIG. 8, the ESL 215 may include materials with dielectric constant that is lower than about 5, such as N doped SiC and/or O doped SiC. The thickness of the ESL 215 may be in a range from about 10 Å to about 100 Å, and the dielectric layer 216 may not be necessary in the IC structure 200. The formation of the ESL 215 may include using $CO_2$ or $N_2O$ plasma. The $CO_2$ or $N_2O$ plasma may oxidize the cap layer 210 and/or the conductive feature 208. In some embodiments, the formation of the contact trenches in the IC structure 200 of FIG. 8 may include an etching process including more than one step. For example, the etching process includes a first etch step to etch the low-k dielectric layer 218 in the contact regions. The first etch step may include a dry etch using difluoromethane ($CH_2F_2$) plasma, and the first etch step stops at the ESL 215. Then a second etch step is used to selectively remove the ESL 215 in the contact regions using a wet etch with a suitable etchant, such as a hot phosphorous ($H_3PO_4$) acid. The second etching step selectively removes the ESL 215 in the contact regions and stops at the Al-containing dielectric layer 212. Therefore, the Al-containing dielectric layer 212 may protect the substrate 202 or the lower level interconnect features, including the conductive feature 208 or the cap layer 210, from being damaged during the contact trench etching process. As discussed earlier in the present disclosure, the Al-containing dielectric layer 212 may effectively prevent the cap layer 210 and/or the conductive feature 208 from being oxidized by the $CO_2$ or $N_2O$ plasma.

In some alternative embodiments as shown in FIG. 9, neither the ESL 215 nor the dielectric layer 216 is necessary in the IC structure 200 when the IC structure includes an Al-containing dielectric layer 212. In some embodiments, the formation of the contact trenches in the IC structure 200 of FIG. 9 may include a one-step etching process using a plasma etch with a suitable etchant, such as a fluorine-containing etchant, to selectively etch the low-k dielectric layer 218 in the contact regions without damaging the Al-containing dielectric layer 212 or the conductive feature 208. This is due to the high etching selectivity of the Al-containing dielectric layer 212 over the low-k dielectric layer 218, so that the contact trench etching process may stop at the Al-containing dielectric layer 212. In addition, the Al-containing dielectric layer 212 may effectively prevent the cap layer 210 and/or the conductive feature 208 from being oxidized. In some alternative embodiments, the IC structure including the Al-containing dielectric layer may also eliminate the cap layer 210, leaving the Al-containing dielectric layer 212 as the interfacial layer between the upper level and the lower level of the interconnect structure.

Figure 10:
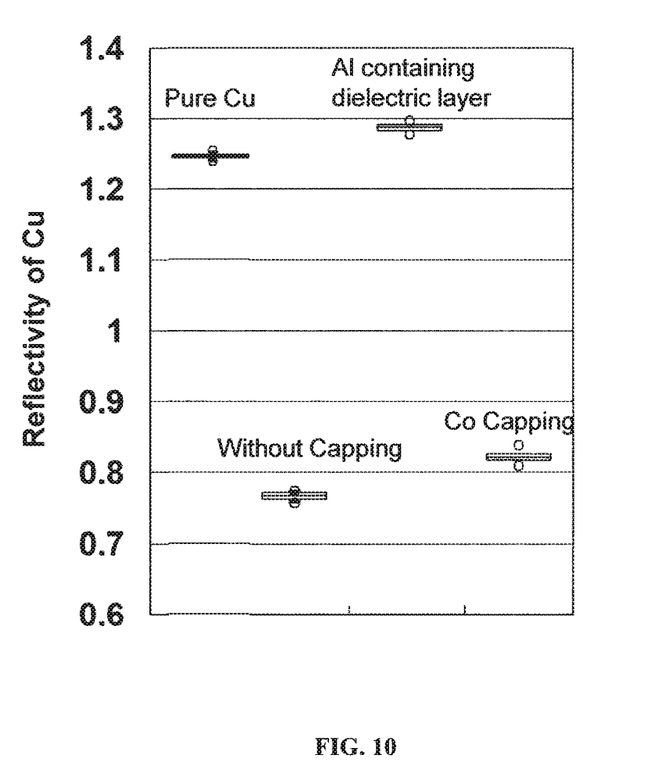
FIG. 10 compares the reflectivity of the surface of the Cu layer in the IC structure with different capping schemes being exposed to $N_2O$ plasma according to some embodiments of the present disclosure.

FIG. 10 compares the reflectivity of the surface of the Cu layer in the IC structure with different capping schemes when exposed to $N_2O$ plasma according to some embodiments of the present disclosure. As shown in FIG. 11, the pure Cu without any capping layer or the Cu with only Co capping layer demonstrate obvious oxidation effect, as evidenced by the reduced reflectivity of the surface of the Cu layer. The reduced reflectivity can be caused by the formation of the copper oxide layer on the surface of the Cu layer. When the Cu layer is covered with the Al-containing dielectric layer 212 as discussed in the present disclosure (e.g., FIG. 7, FIG. 8, or FIG. 9), the Cu layer maintains its high reflectivity as shown in FIG. 11. FIG. 11 shows an effective anti-oxidation capability of the Al-containing dielectric layer, which could prevent the surface of the Cu layer from being oxidized by the oxygen included plasma (e.g., $CO_2$ or $N_2O$ plasma).

An IC structure without the Al-containing dielectric layer may result in an over etching problem. The over etching can result in an increased contact resistance from the upper level to the lower level in the interconnect structure, and can affect the reliability performance of the IC structure and the final device. Although not intended to be limiting, the present disclosure provides one or more benefits. The Al-containing dielectric layer included in the IC structure as discussed in the present disclosure can effectively prevent the over etching during the contact trench etching process due to the high etching selectivity of the Al-containing dielectric. The Al-containing dielectric layer can also effectively reduce the capacitance and provide an improved reliability performance as the dimension of the IC structure scales down.

The present disclosure provides a method for forming an integrated circuit (IC) structure. The method includes providing a substrate including a conductive feature; forming an aluminum (Al)-containing dielectric layer on the conductive feature; forming a low-k dielectric layer on the Al-containing dielectric layer; and etching the low-k dielectric layer to form a contact trench aligned with the conductive feature. A bottom of the contact trench is on a surface of the Al-containing dielectric layer.

In some embodiments, the method further includes forming a cap layer between the conductive feature and the Al-containing dielectric layer. A width of the cap layer is substantially similar to a width of the conductive feature. The forming the cap layer may include selectively depositing at least one layer of Co, Mn, Ni, Ru, or Ti to be aligned with the conductive feature.

In some embodiments, the method further includes forming an etch stop layer (ESL) between the Al-containing dielectric layer and the low-k dielectric layer; and etching the ESL to form the contact trench. The forming the ESL may include depositing a layer including at least one of N doped SiC layer or O doped SiC layer using a plasma gas, the plasma gas including at least one of $CO_2$ or $N_2O$. The forming the ESL may include depositing a layer including at least one of N doped SiC layer or $Si_3N_4$ layer using silane ($SiH_4$) and $NH_3$ plasma. The etching the low-k dielectric layer may include a dry etch process using a fluorine-containing etchant. The etching the ESL may include a wet etch process which stops at the Al-containing dielectric layer. In some embodiments, the method further includes forming a dielectric layer between the ESL and the low-k dielectric layer; and etching the dielectric layer to form the contact trench.

In some embodiments, the forming the Al-containing dielectric layer includes performing a $NH_3$ plasma treatment; importing an Al-containing organic precursor; and depositing the Al-containing dielectric layer including Al, N and O. The Al-containing dielectric layer is formed using a process selected from the group consisting of chemical vapor deposition (CVD), atomic layer deposition (ALD), and a combination thereof. The forming the Al-containing dielectric layer may include depositing the Al-containing dielectric layer using a chamber pressure in a range from about 0.1 torr to about 100 torr. The forming the Al-containing dielectric layer may include depositing the Al-containing dielectric layer using a RF power in a range from about 10 W to about 1000 W. The forming the Al-containing dielectric layer may include depositing the Al-containing dielectric layer at a temperature in a range from about 150° C. to about 400° C. The forming the Al-containing dielectric layer may include depositing the Al-containing dielectric layer using a flow rate of the $NH_3$ plasma in a range from about 50 sccm to about 5000 sccm.

The present disclosure also provides a method for forming an integrated circuit (IC) structure. The method includes providing a substrate including a conductive feature; forming a cap layer on the conductive feature; forming an aluminum (AO-containing dielectric layer on the cap layer; forming an etch stop layer (ESL) on the Al-containing dielectric layer; forming a low-k dielectric layer on the ESL; and etching the low-k dielectric layer and the ESL to form a contact trench aligned with the conductive feature. A bottom of the contact trench is on a surface of the Al-containing dielectric layer.

In some embodiments, the etching the low-k dielectric layer and the ESL includes dry etching the low-k dielectric layer using a fluorine-containing etchant, and wet etching the ESL using a hot phosphorous acid ($H_3PO_4$). The wet etching the ESL stops at the Al-containing dielectric layer.

The present disclosure also provides yet another embodiment of an integrated circuit (IC) structure. The IC structure comprises a substrate including a first conductive feature; a cap layer formed on the conductive feature and aligned with the first conductive feature; an aluminum (Al)-containing dielectric layer disposed on the cap layer; an etch stop layer (ESL) disposed on the Al-containing dielectric layer; a low-k dielectric layer disposed on the ESL; and a second conductive feature filling a contact trench formed through the low-k dielectric layer and the ESL. The second conductive feature is aligned with the first conductive feature. The Al-containing dielectric layer is inserted between the cap layer on the first conducive feature and the second conductive feature. A width of the cap layer is substantially similar to a width of the first conductive feature. The Al-containing dielectric layer is formed to cover the cap layer and the substrate.

In some embodiments, a thickness of the ESL is in a range from about 10 Å to about 200 Å. The Al-containing dielectric layer may include Al, N and O. A thickness of the Al-containing dielectric layer is in a range from about 5 Å to about 30 Å.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first conductive element;
a first dielectric layer disposed over an entire upper surface of the first conductive element, wherein the first dielectric layer has a porous structure and contains aluminum, oxygen, and nitrogen;
a second dielectric layer disposed over the first dielectric layer, wherein the first dielectric layer and the second dielectric layer have different material compositions; and
a second conductive element disposed in the second dielectric layer and over the first dielectric layer, wherein a bottom surface of the second conductive element is disposed over the first dielectric layer.

2. The semiconductor device of claim 1, further comprising: a cap layer disposed between the first conductive element and the first dielectric layer.

3. The semiconductor device of claim 2, wherein the cap layer and the first conductive element have substantially similar lateral dimensions.

4. The semiconductor device of claim 1, further comprising: an etch stop layer (ESL) disposed over the first dielectric layer.

5. The semiconductor device of claim 4, wherein an etching selectivity exists between the ESL and the first dielectric layer.

6. The semiconductor device of claim 1, wherein the second conductive element is at least partially aligned with the first conductive element.

7. The semiconductor device of claim 1, further comprising a barrier layer that is disposed below the first dielectric layer and that at least partially surrounds the first conductive element.

8. The semiconductor device of claim 1, wherein an aluminum composition of the first dielectric layer is in a range from about 5 wt % to about 20 wt %.

9. The semiconductor device of claim 1, wherein an oxygen composition of the first dielectric layer is in a range from about 60 wt % to about 80 wt %.

10. The semiconductor device of claim 1, wherein a nitrogen composition of the first dielectric layer is in a range from about 10 wt % to about 30 wt %.

11. The semiconductor device of claim 1, wherein the first dielectric layer has a refractive index in a range from about 1.76 to about 1.80.

12. The semiconductor device of claim 1, wherein the first dielectric layer has thickness range between about 5 Å and about 30 Å.

13. The semiconductor device of claim 1, wherein a material composition of the first dielectric layer is configured to allow a diffusion of copper.

14. A semiconductor device, comprising:
a first conductive element;
a cap layer located over the first conductive element;
a first dielectric layer located over the cap layer, wherein the first dielectric layer has a porous structure and contains aluminum, oxygen, and nitrogen;
an etch stop layer located over the first dielectric layer;
a second dielectric layer located over the etch stop layer, wherein the second dielectric layer contains a low-k dielectric material; and
a second conductive element extending through the second dielectric layer, wherein the second conductive element is located over, and at least partially aligned with, the first conductive element;

wherein:
an aluminum composition of the first dielectric layer is in a range from about 5 wt % to about 20 wt %; or
an oxygen composition of the first dielectric layer is in a range from about 60 wt % to about 80 wt %.

15. The semiconductor device of claim 14, wherein: the first dielectric layer is disposed between the first conductive element and a bottommost portion of the second conductive element.

16. The semiconductor device of claim 14, wherein:
the first dielectric layer has a refractive index in a range from about 1.76 to about 1.80; and
the first dielectric layer has thickness range between about 5 Å and about 30 Å.

17. An integrated circuit (IC) structure, comprising:
a substrate including a first conductive feature;
a cap layer formed on the first conductive feature and aligned with the first conductive feature, a width of the cap layer being substantially similar to a width of the first conductive feature;
an aluminum (Al)-containing dielectric layer disposed on the cap layer, the Al-containing dielectric layer being formed to cover the substrate and an entire upper surface of the cap layer;
an etch stop layer (ESL) disposed on the Al-containing dielectric layer;
a low-k dielectric layer disposed on the ESL; and
a second conductive feature filling a contact trench formed through the low-k dielectric layer and the ESL, the second conductive feature being aligned with the first conductive feature,
wherein the Al-containing dielectric layer is formed between the cap layer on the first conducive feature and the second conductive feature, and wherein an upper surface of the Al-containing dielectric layer is disposed below a bottom surface of the second conductive feature.

18. The IC structure of claim 17, wherein a thickness of the ESL is in a range from about 10 Å to about 200 Å.

19. The IC structure of claim 17, wherein the Al-containing dielectric layer includes Al, N and O, and wherein:
an aluminum composition of the Al-containing dielectric layer is in a range from about 5 wt % to about 20 wt %; or
an oxygen composition of the Al-containing dielectric layer is in a range from about 60 wt % to about 80 wt %.

20. The IC structure of claim 17, wherein a thickness of the Al-containing dielectric layer is in a range from about 5 Å to about 30 Å.

* * * * *